United States Patent [19]

Williams

[11] 4,302,100
[45] Nov. 24, 1981

[54] PHOTOGRAPHIC DIRECT-PRINT SYSTEM

[75] Inventor: Eric B. Williams, Akron, Ohio

[73] Assignee: Portage Newspaper Supply Company, Akron, Ohio

[21] Appl. No.: 127,417

[22] Filed: Mar. 5, 1980

[51] Int. Cl.³ .............................................. G03B 27/80
[52] U.S. Cl. ......................................... 355/68; 355/83
[58] Field of Search .................................. 355/67–71, 355/83

[56] References Cited

U.S. PATENT DOCUMENTS

| | | | |
|---|---|---|---|
| 3,542,470 | 11/1970 | Ost | 355/68 |
| 3,732,011 | 5/1973 | Hansard | 355/68 |
| 3,868,183 | 2/1975 | Childers | 355/68 |
| 4,025,190 | 5/1977 | Hughes | 355/68 |

Primary Examiner—George H. Miller, Jr.
Assistant Examiner—W. J. Brady
Attorney, Agent, or Firm—Oldham, Oldham, Hudak & Weber Co.

[57] ABSTRACT

A photographic direct-print system for producing a screened print from a continuous tone negative. Fundamentally, the invention includes an enlarger having a main lamp associated therewith for receiving a negative and casting an image thereof upon an easel. Flashlamps are maintained in juxtaposition to the easel for further illuminating the same. A density read-out circuit, comprising a photodiode presenting an output to a digital volt meter, is included for measuring the light intensity of various areas of the image, such read-out determining the lens setting of the enlarger and the intensity of the flashlamps, as regulated by a power phase control circuit. A timer is included for controlling a period of simultaneous energization of the enlarger and flashlamps, the timer being controlled by a clock having a frequency which is dependent upon the intensity of the main lamp of the enlarger.

13 Claims, 6 Drawing Figures

PHOTOGRAPHIC DIRECT-PRINT SYSTEM

BACKGROUND OF THE INVENTION

The instant invention resides in the art of photographic equipment and more particularly relates to a device allowing for the direct production of a screened print made directly from a continuous tone negative.

Previously, in the newspaper industry, photographic negatives would be considered for publication as newspaper prints and would be developed and enlarged to a fixed predetermined print size. The editor would select from the available prints the pictures he desired for inclusion in the newspaper. He would then crop the selected prints by marking on the backs thereof the portions to be deleted in the published picture. He would further select an appropriate size for the picture as would be dictated by column width and the positioning of the associated article within the newspaper. With the prints having been cropped and appropriate sizes selected, the same would be placed in a standard process camera through which an operator could crop and size the print so as to acquire from the process camera the screened print of the desired picture for inclusion in the newspaper. As will be appreciated by those skilled in the art, such a process includes the time-consuming and expensive intermediate steps of the production of a continuous tone print with the subsequent production of a screened print made by diffusion transfer or contact print from a screened negative.

In order to conserve time and expense in the production of a newspaper layout, it is more beneficial that the exposed negative as taken by the newspaper photographer be used directly for producing the screened print, eliminating the time-consuming and costly intermediate steps of the prior art. Further, in prior art systems, it is extremely difficult to obtain a proper balance between the highlight areas of a print and the shadow areas of a print so as to achieve good clarity. Indeed, utilizing presently known process cameras, several passes are generally required for producing an acceptable screened print which will achieve a clear, sharp picture in the final publication. However, multiple attempts at such production are intolerable in a day of spiraling costs of labor and photographic development supplies. It is therefore most desirable to achieve prints of sharp clarity or of "balanced dot" directly from a continuous tone negative, with the first screened print achieved thereby being of the ideal quality for newspaper publication.

Finally, the prior art has required that the operator of the process camera by one of some significant skill. Such skills are those acquired and developed over a period of time since only the operator's eye is used to determine print clarity and subsequent process camera adjustments. By providing a system which includes means for measuring the exposure of the screened print, adjustments may be made on an analytical basis rather than the subjective basis of the operator's own judgment.

OBJECTS OF THE INVENTION

In light of the foregoing, it is an object of the instant invention to provide a photographic direct-print system which allows for the production of a screened print directly from a continuous tone negative.

Another object of the invention is to provide a photographic direct-print system which includes a density measuring device which may be used for sensing the highlight and shadow areas of the image of the screened print, such reading providing analytical bases for system adjustments by the operator.

An additional object of the invention is to provide a photographic direct-print system wherein the exposure time for producing a screened print is automatically adjusted to compensate for changes in the lamp intensity of the enlarger used for development.

Yet a further object of the invention is to provide a photographic direct-print system which includes flashlamps of operator-regulatable intensity.

Still another object of the invention is to provide a photographic direct-print system which allows prints to be directly made from a continuous tone negative in a time efficient and cost effective manner and which system is composed of elements readily available in the art.

SUMMARY OF THE INVENTION

The foregoing and other objects of the invention which will become apparent as the detailed description proceeds are achieved by a direct-print system for producing screened prints, comprising: an enlarger having a main lamp for receiving a photographic negative and for exposing an image thereof upon an easel; a flashlamp in juxtaposition to said easel for casting light thereupon; density sensing means for measuring the density of selected areas of said image; and a variable timer connected to said flashlamp and said enlarger for regulating the period of time for which said flashlamp and main lamp are illuminated upon said easel.

DESCRIPTION OF DRAWINGS

For a complete understanding of the objects, techniques, and structure of the invention, reference should be had to the following detailed description and accompanying drawings wherein.

DETAILED DESCRIPTION OF PREFERRED EMBODIMENT

Figure 1:
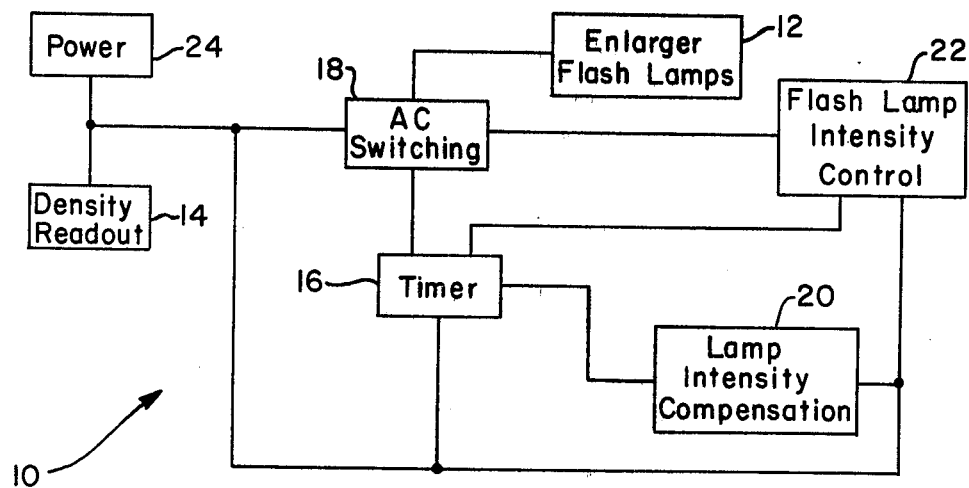
FIG. 1 is a schematic block diagram of the photographic direct-print system of the invention.

Referring now to the drawings and more particularly FIG. 1, it can be seen that the photographic direct-print system of the invention is designated generally by the numeral 10. The same includes an enlarger 12 which, in standard fashion, has associated therewith an easel for receiving and maintaining photographic paper, covered by a screen, through which the enlarger may expose a negative for development upon the photographic paper. As is further known in the art, the easel may have associated in juxtaposition therewith flashlamps or lamps for flash exposure through the screen and upon the photographic paper. Finally, a safe light may similarly be mounted on the wall closely adjacent to the easel and enlarger for providing a work light at the easel to assist in properly positioning the screen and photographic paper. A typical enlarger of the type well known in the art and suitable for utilization in the instant invention is the Beseler 23C, which includes means for cropping and sizing the negative received for development of a screened print. Of course, the enlarger itself includes a main lamp for exposure of the negative through the screen and onto the photographic paper.

Also included as part and parcel of the invention is a density read-out 14, including a probe which may be used by an operator for measuring the intensity of the light in both light and dark areas as the same will be experienced by the photographic paper in the exposure process. As will be elaborated upon hereinafter, the operator may sense the light areas of the exposure with the main lamp of the enlarger 12 illuminated, and adjust the lens opening of the enlarger 12 to achieve a desired reading. Next, utilizing the density read-out circuit 14, the operator may illuminate the flashlamps and measure the light intensity of the dark areas of the image and makde appropriate adjustments of the flashlamp intensity until a desired reading is achieved. At this point in time, both the main lamp of the enlarger and the flashlamps have been adjusted such that the light and dark areas of the negative (corresponding to dark and light areas of the print) will be characterized by equal or "balanced dots."

A timer 16 is included in the system 10 for controlling the energization period of the flashlamps and the enlarger 12. The timer 16 is adjustable to allow the operator to select the desired period of exposure of the screened print. Control of the timer 16 over the flashlamps and enlarger 12 is achieved via the AC switching circuitry 18, again to be discussed in more detail hereinafter.

As is known to those skilled in the art, the lamp intensity of the main lamp of the enlarger 12 may fluctuate or vary over a period of use due to aging, dirt, alteration of lamp filament positioning, or the like. When the lamp intensity changes, the period of required exposure similarly changes. Accordingly, there is provided a lamp intensity compensation circuit 20 in interconnection with the timer 16 such that the exposure time may be altered as a function of the intensity of the main lamp itself. In similar fashion, the flashlamp intensity control circuit 22 is provided to allow the user to ajust the flashlamp intensity so as to achieve a balanced dot print, such adjustment being made when measuring the dark areas of the image with the density probe of the circuit 14 as earlier discussed. As will become apparent hereinafter, the control circuit 22 fundamentally comprises a power phase control circuit, regulating through the AC switching circuit 18 the amount of AC power delivered to the flashlamps.

With final reference to FIG. 1, it will be appreciated that there is, of course, provided a power circuit 24 including both AC line voltages and DC power supplies which, through appropriate transformers, filters, and the like, provide the desired DC power for operating the electronics of the invention.

Figure 2:
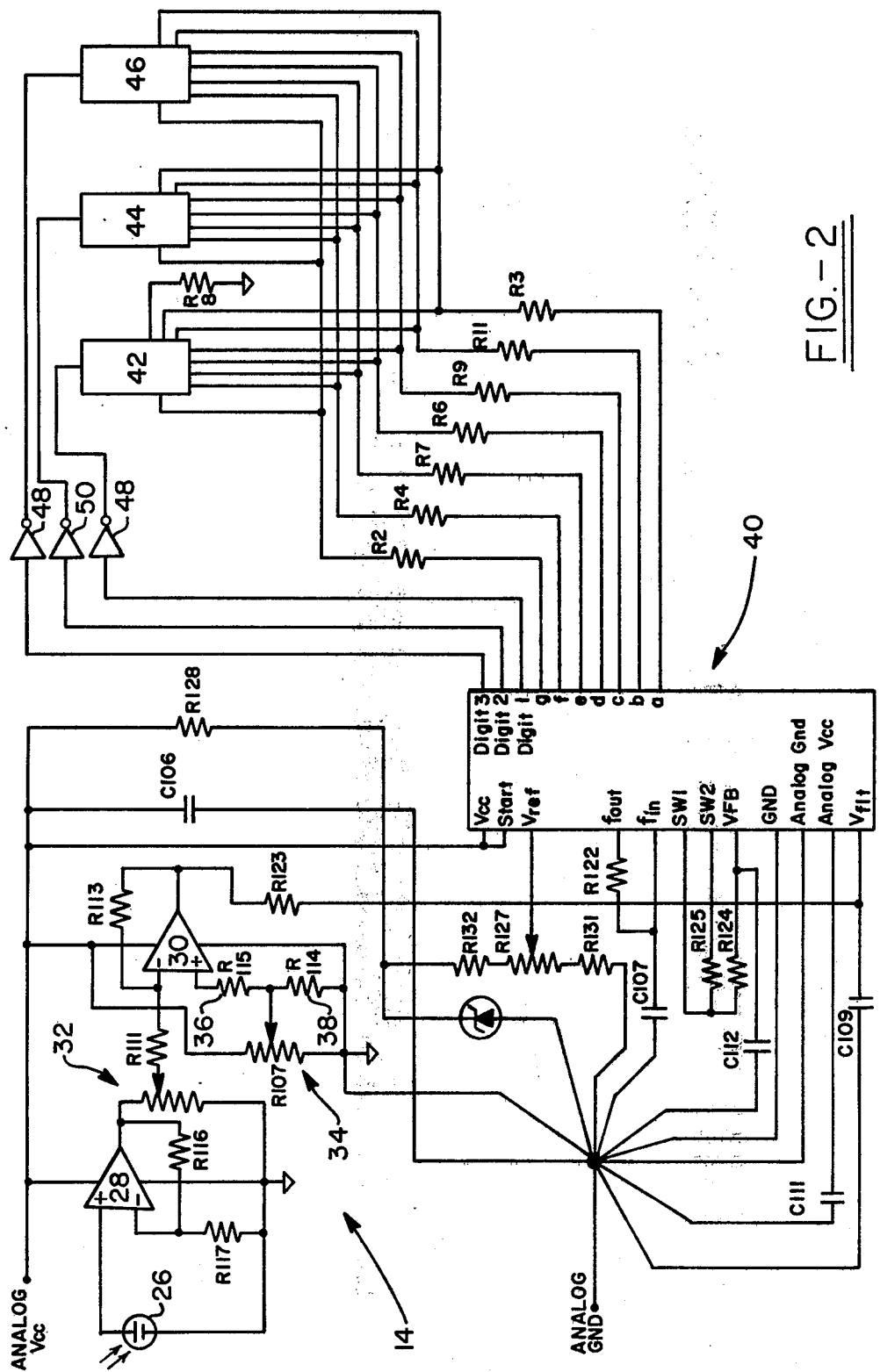
FIG. 2 is a schematic diagram of the density sensing and read-out circuitry of the invention.

With reference now to FIG. 2, it can be seen that the density read-out circuit 14 includes a photodiode probe 26 which may be used for placement into the image cast by the enlarger 12 to monitor both the high and low light intensity levels as discussed above. An operational amplifier 28 receives the output from the photodiode 26 which is a current signal corresponding to the sensed light intensity. The amplifier 28 converts the current signal to a voltage signal and may include appropriate feedback circuits to achieve a desired gain. The voltage output signal from the amplifier 28 is passed to the operational amplifier 30 which operates in standard fashion as an adder. As can be seen, the negative input of the amplifier 30 is through an operator-adjustable potentiometer 32 while the positive input thereof is connected to a voltage divider comprising the potentiometer 34 and resistors 36,38. The potentiometers 32,34 are utilized for tailoring the circuit 14 to a particular enlarger. For example, a negative of known good quality may be placed in the enlarger 12 with the resulting image being cast upon the associated easel. With the photodiode probe 26 placed in a totally dark area of the image, adjustment of the potentiometer 34 may be made to achieve a desired output of the amplifier 30, as monitored via a digital volt meter 40, to be discussed hereinafter. Similarly, with the probe 26 placed in an area of maximum light intensity in the image, the potentiometer 32 may be adjusted for a desired output. With the potentiometers so adjusted, the operating range of the circuit 14 is established and no further adjustment need be made. It will be understood that for any specific enlarger, the potentiometers 32,34 might well be replaced by resistors of fixed value.

With the amplifier 30 operating as an adder, the output thereof is a voltage corresponding to the light levels sensed by the photodiode probe 26. This voltage is applied to a digital volt meter circuit 40 of standard nature. Indeed, the circuit 40 shown in FIG. 2 is that described in the 1977 National Semiconductor DATA BOOK MOS/LSI, published by National Semiconductor Corporation. Such a circuit presents a seven segment output for each of three digits, the outputs for each of the three digits being multiplexed at such a frequency as to give the appearance on the seven segment decode LED display modules 42–46 of constant illumination. Drivers for achieving such multiplexing comprise the inverters 48–52. It should now be appreciated that the circuitry 14 provides a visual output corresponding to the light sensed by the probe 26, such visual output allowing the operator to adjust the lens opening of the enlarger 12 and the intensity of the flashlamps to achieve the desired readings established via the potentiometers 32,34 for achieving prints of known good quality as previously discussed.

Figure 3:
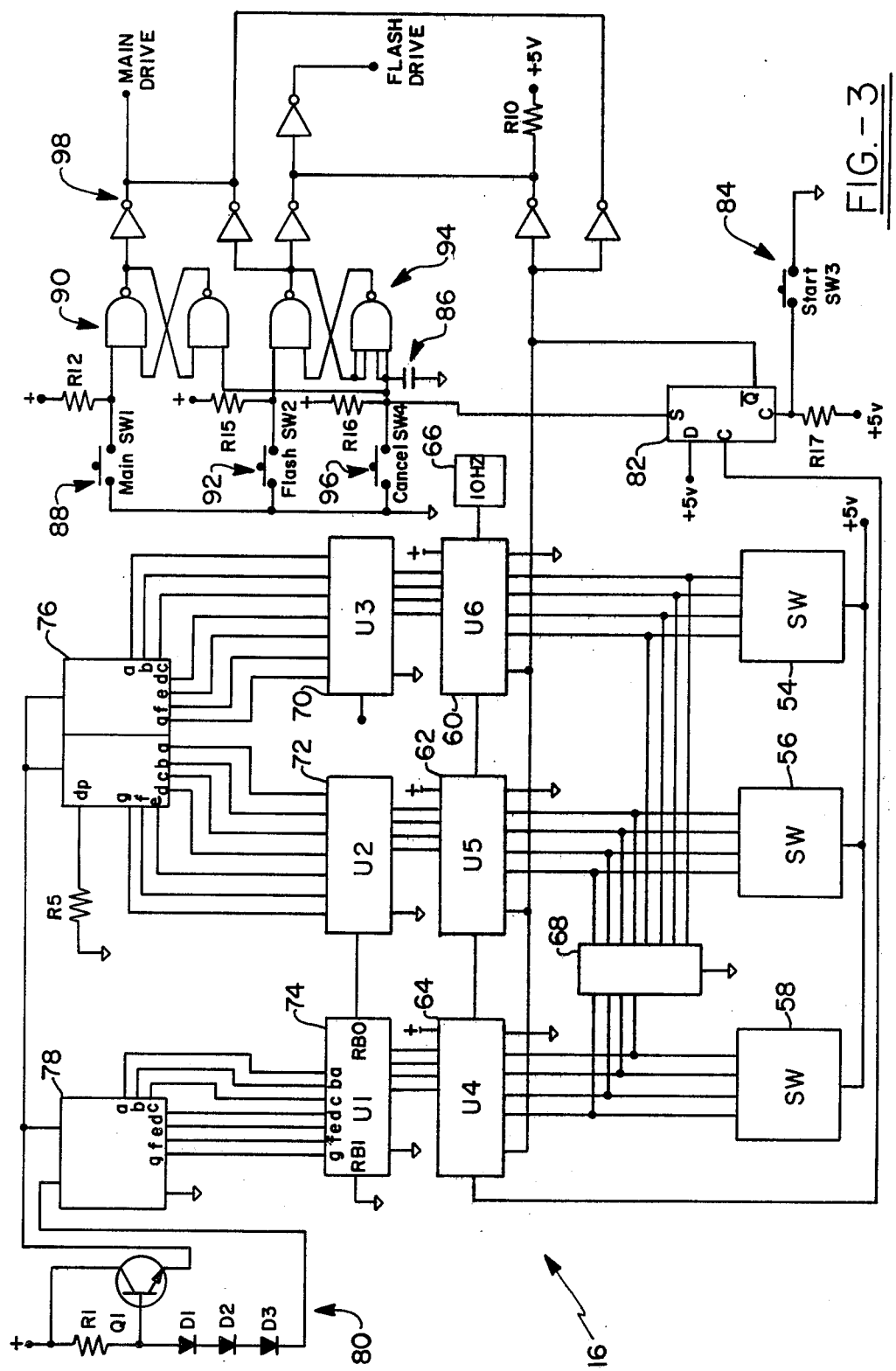
FIG. 3 is a detailed schematic of the timing circuitry of the invention.

The timer 16 is shown in detail in FIG. 3 as including a plurality of thumb-wheel switches 54–58 for selecting the time for exposure via illumination of the main lamp of the enlarger and the flashlamps. The time selected by the operator will typically be of fixed duration once such time has been established by trial and error for a negative of known good quality. With that time selected via the switches 54–58, the same is loaded into the down counters 60–64 via the terminating resistors of the resistor pack 68. The time period loaded into the counters 60–64 is passed through the binary coded decimal to seven segment decoders 70–74 to the LED displays 76–78. A current drive circuit 80 is provided for achieving a variable current at a constant voltage output for driving the displays 76–78.

Control of the timing circuit 16 is achieved, in large part, by the D-type flip-flop 82. When the start switch 84 is actuated, resetting the flip-flop 82, the complementary output of the flip-flop 82 enables the counters 60–64 which then being counting down under control of the 10 hz clock 66 to be discussed hereinafter. When the counter counts down to zero, the counter 64 clocks the flip-flop 82, setting the same, and thus inhibiting the counters 60-64 awaiting resetting of the flip-flop 82 as by the switch 84.

When power is initially turned on, the capacitor 86 holds the set input of the flip-flop 82 low to initialize the flip-flop in the set position. This inhibits the operation of the counters 60-64 until actuation of the start switch 84.

The main switch 88 is an operator-actuatable switch which, when closed, sets the latch 90 to emit a signal turning on the main lamp of the enlarger 12 as well as discussed hereinafter. With the main lamp on, the opening of the lens of the enlarger 12 may be adjusted to achieve the desired reading as discussed above. Similarly, the switch 92 is operative for setting the latch 94 and presenting an output signal therefrom which is applied to circuitry to be described hereinafter for illuminating the flashlamps maintained in juxtaposition to the easel. With these lamps illuminated, appropriate adjustment of the lamp intensity may be made to achieve the desired reading discussed hereinabove. Finally, the cancel switch 96 is provided to reset the latches 90,94, and thereby terminate the illumination of the main and flashlamps achieved via the switches 88,92. It will also be appreciated that the complementary output of the flip-flop 82 passes the appropriate ones of the inverter network 98 such that both the main and flashlamps are illuminated for the period of time determined by the counter elements 54-68, the coexistent illumination of such lamps providing exposure of the screened print.

Figure 4:
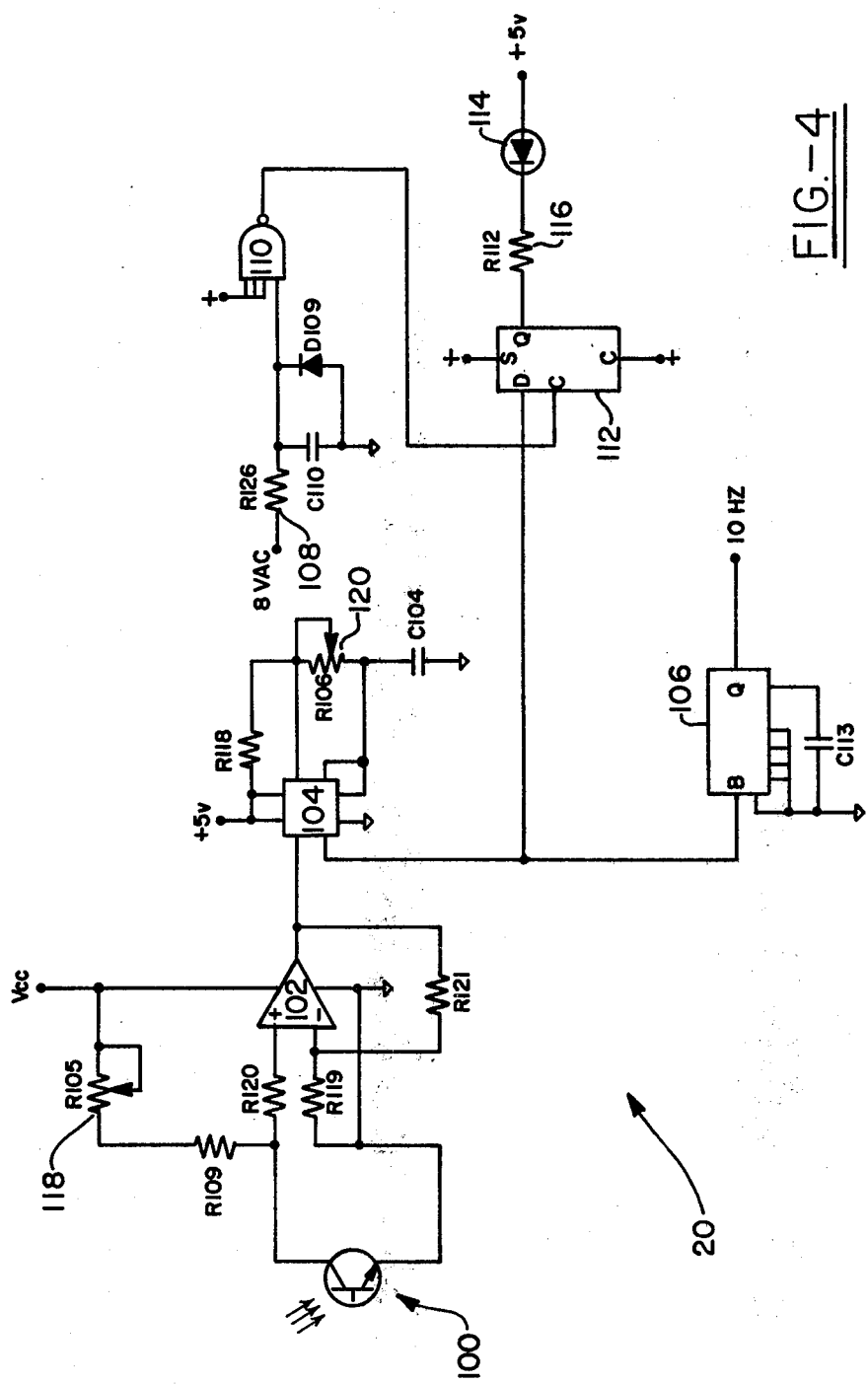
FIG. 4 is a detailed schematic of the lamp intensity timer compensation circuitry of the invention.

As mentioned above, an important feature of the instant invention is the lamp intensity compensation circuit 20, shown in detail in FIG. 4. A phototransistor 100 is placed in juxtaposition to the main lamp of the enlarger 12, sensing the light intensity output of such lamp. The phototransistor 100 presents an output corresponding to the intensity of the light sensed and such signal is applied to the operational amplifier 102 which is provided for scaling and for converting the voltage drop signal of the transistor 100 to a voltage output. The output signal of the amplifier 102 is in turn applied to a timer or oscillator 104 which presents a pulsating output of fixed amplitude and of a frequency dependent, in part, on the amplitude of the input received from the amplifier 102. Due to specific circuit values selected, the output frequency of the timer 104 is approximately 60 hz. This output is passed through the divider 106 which divides the 60 hz output by 6, presenting the 10 hz clock 66 of FIG. 3.

As further shown in FIG. 4, the resistor 108 receives a low voltage 60 hz AC signal as from a transformer connected to the AC line voltage supply. This signal is applied to the Schmitt trigger 110 which, in standard fashion, then presents a 60 hz squarewave to the clock input of the D-tye flip-flop 112. The data input to the flip-flop 112 is the 60 hz signal received from the timer 104, the actual frequency of which will vary depending upon the output of the amplifier 102. The output of the flip-flop 112 is applied through a resistor 116 to an LED 114. It will be appreciated by those skilled in the art that if the data input and the clock input to the flip-flop 112 are not synchronized, the LED 114 will blink due to effective changes in the data applied to the data input of the flip-flop 112. Such a situation indicates that the output frequency of the timer 104 is not 60 hz and, accordingly, the output of the divider 106 is not 10 hz, as is required for operation of the counters 60-64. In order to initialize the system 10 and to properly calibrate the clock 66, the potentiometer 118 is adjusted to alter the voltage output of the amplifier 102 and hence the output frequency of the timer 104. This coarse adjustment is made until the frequency of blinking of the LED 114 is substantially reduced. At this point in time, fine adjustment is made via the potentiometer 118 to the point where the output of the oscillator 104 and line voltage are synchronous and blinking terminates.

By following the procedure just outlined when setting up the system 10, the clock 66, controlling the counters 60-64, is tuned to the intensity of the main lamp of the enlarger 12. Consequently, should the intensity of that lamp later change, the actual frequency of the 10 hz clock 66 will also change, such that the exposure time will compensate for the change in lamp intensity. Accordingly, total exposure will always remain constant since exposure is a product of time and intensity. In actuality, once the potentiometers 118,120 have been set when the system 10 is installed, no further changes to the same need be made, and automatic compensation for changes in lamp intensity will be continually made.

Figure 5:
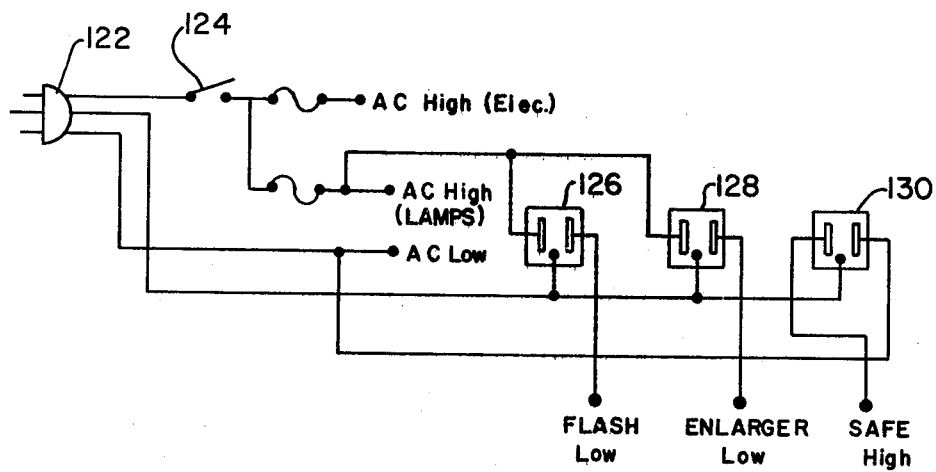
FIG. 5 is a schematic diagram of the AC power connections utilized in accordance with the invention.

There is shown in FIG. 5 a hard wire diagram of the AC power supplied to the element comprising the system 10. As shown, an AC plug 122, having a common ground line, is connected through a safety switch 124 to apply AC power to the electronics of, for example, the power circuitry 24. The high line of the AC line voltage is also applied to one side of the jack 126 for receiving a power plug for the flashlamps and to one side of the jack 128 for receiving a plug from the power line for the enlarger 12. The safe light mentioned hereinabove is adapted for reception by the jack 130, having one side thereof connected to the low side of the line voltage. The other sides of the jacks 126-130 connected to and controlled by the AC switching circuitry 18 and the flashlamp intensity control circuitry 22 of FIG. 6. As shown, the low side of the flash plug 126 of FIG. 5 is connected through a choke 132 and capacitor 134 to a full wave rectifier bridge 136. The rectified signal output of the bridge 136 is clipped by the zener diode 138 to limit voltage to transistor 150. The capacitor 140 is charged by the rectified signal through the resistor 142 and the voltage divider comprising resistor 144 and the potentiometer 146. A blocking diode 148 is connected to the charging capacitor 140 in standard fashion. A unijunction transistor 150 is controlled by the charge on the capacitor 140 to conduct when that charge reaches a predetermined level. The time that such charging takes is, of course, determined by the RC network 140-146.

When the capacitor 140 is charged to a sufficient level to gate the transistor 150 into conduction, the pulse through the pulse transformer winding 152a couples into the winding 152b to gate the triac 154 into conduction, connecting the jack 126 to the low side of the AC line. It will be appreciated that such conduction lasts for portions of half cycles of the AC signal as determined by the adjustment of the potentiometer 146. In other words, the power to the flashlamps is controlled by the power phase circuit just described and, accordingly, the intensity of the flashlamp is regulated by the operator's adjustment of the potentiometer 146. The significance of this feature was discussed hereinabove with respect to utilization of the density measurement and read-out circuit 14 in setting the lens opening of the enlarger 12 and adjusting the flashlamp intensity to obtain a balanced dot print.

Figure 6:
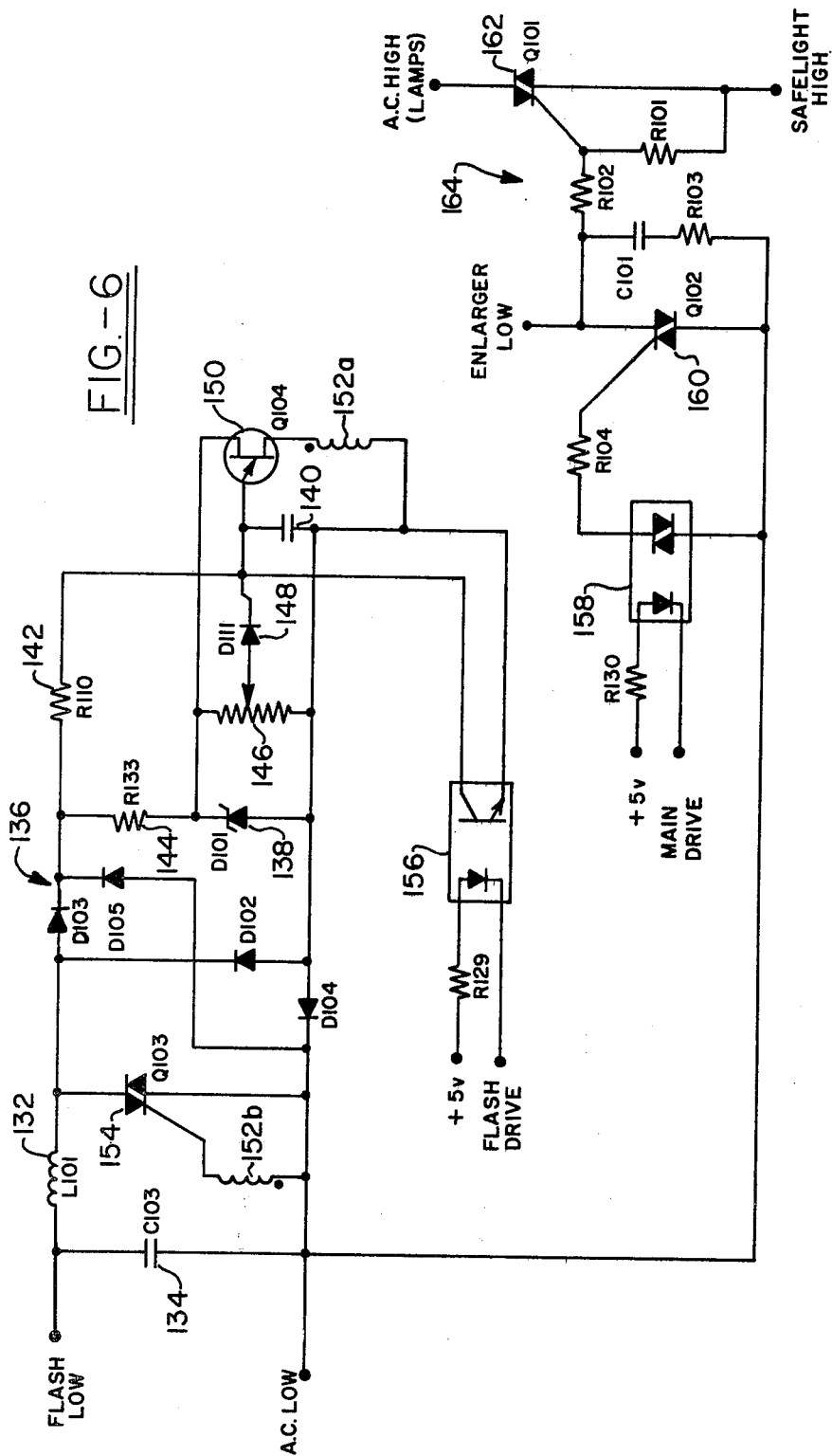
FIG. 6 is a detailed circuit schematic of the AC switching circuitry utilized for controlling the enlarger lamp, flashlamps, and safe light used in the photograhic direct-print system of the invention.

Energization of the flashlamps in controlled by the opto-isolator 156 which, in turn, is controlled by the latch 94 or the flip-flop 82 discussed hereinabove. In the circuit of FIG. 6 it will be apparent that the flashlamps are off when the opto-isolator 156 is turned on since the transistor of the element 156 when serves to discharge the capacitor 140.

With continued reference to FIG. 6, it will be noted that an opto-isolator 158 is connected to and receives an output from the latch 90 and flip-flop 82 of the timing circuitry of FIG. 3. When the main lamp of the enlarger 12 is to be illuminated, the opto-isolator 158 conducts, turning on the triac 160. Such conduction connects the jack 128 to the low side of the AC power line, passing power to the main lamp of the enlarger 12. Similarly, with current passed through the triac 160 the gate of the triac 162 is pulled low, turning off that triac via the circuitry 164. Accordingly, the safe light jack 130 to which the triac 162 is connected is disconnected from power and the safe light turns off. It should therefore be apparent that the safe light is turned off at any time that the enlarger main lamp is turned on, the triacs 160,162 being mutually exclusively gated.

In use, the system 10 is utilized by placing the desired negative into the enlarger 12 and using the inherent equipment thereof for cropping and sizing the negative for printing the desired print. Next, the switch 88 is depressed, setting the latch 90, and turning on the main lamp of the enlarger while turning off the safe light above the easel. The photodiode 26 is then placed into the lightest of areas of the image and a reading is taken on the digital volt meter 40. The lens opening of the enlarger 12 is then adjusted until the desired reading on the meter 40 is achieved. Next, the switch 92 is depressed, setting the latch 94 and illuminating the flashlamps via the opto-isolator 156. The photodiode 26 is then used to probe the darkest of areas of the image cast upon the easel and the potentiometer 146 is adjusted until a desired reading is achieved. At this point, the cancel switch 96 is actuated to reset the latches 90,94, turning off the main and flashlamps and again illuminating the safe light.

With the adjustments described directly above, photographic paper is then placed upon the easel and a photographic screen placed thereover. The easel vacuum is turned on to hold down the paper and the same is smoothed out upon the easel. The start switch 84 is then depressed, starting the timer of FIG. 3 which is run at a clock rate via the clock 66 which is dependent upon the actual intensity of the lamp of the enlarger and sensed by the phototransistor 100. While the timer is timing out, the flashlamps and the enlarger are turned on while the safe light is turned off. When the timer times out, the flashlamps and enlarger turn off and the safe light is re-illuminated. As such time, the screen print has been properly exposed upon the photographic paper and is ready for standard processing techniques to prepare it for publication.

Thus it can be seen that the objects of the invention have been satisfied by the structure and techniques presented hereinabove. While in accordance with the patent statutes only the best mode and preferred embodiment of the invention has been presented and described in detail, it is to be understood that the invention is not limited thereto or thereby. Accordingly, for an appreciation of the true scope and breadth of the invention, reference should be had to the following claims.

I claim:

1. A direct-print system for producing screened prints comprising:
    an enlarger having a main lamp for receiving a photo negative and for exposing an image thereof upon an easel;
    a flashlamp in juxtaposition to said easel for casting light thereupon;
    density sensing means for measuring the density of selected areas of said image;
    a variable timer, comprising a counter controlled by a first operator-actuatable switch, connected to said flashlamp and said enlarger for regulating the period of time for which said flashlamp and main lamp are illuminated upon said ease; and
    a latch interconnected between said first operator-actuatable switch and said counter, said latch enabling said counter upon actuation of said switch and inhibiting said counter after a predetermined period of time, said latch effecting the simultaneous illumination of said main lamp and flashlamp for said period of time.

2. The system according to claim 1 wherein said density sensing means comprises a photosensor presenting an electrical output corresponding to the light incident thereto.

3. The system according to claim 2 wherein said density sensing means further comprises a meter operatively connected to said photosensor, receiving said electrical output, and presenting a visual indicia of said electrical output.

4. The system according to claim 3 which further includes an amplifier interconnected between said photosensor and said meter, said amplifier including adjustment means for scaling said visual indicia to said electrical output.

5. The system according to claim 1 which further includes second and third operator-actuatable switches respectively connected to said main and flashlamps for independently illuminating each of said lamps.

6. The system according to claim 1 wherein said counter is controlled by a clock, the frequency of said clock being regulated by the intensity of said main lamp.

7. Apparatus for producing screened prints directly from a continuous tone negative, comprising:
    an enlarger having a main lamp for receiving the negative and for exposing an image thereof upon an easel;
    a flashlamp in juxtaposition to said easel for casting light thereupon;
    a photosensor for placement within said image and producing an output signal corresponding to the light intensity of said image sensed thereby; and
    a timer connected to said flashlamp and enlarger for regulating the period of time for which said flashlamp and main lamp are illuminated upon said easel, said timer comprising a down counter, driven by a clock, and enabled by a latch, said latch being operatively connected to and controlling the illumination of said main and flashlamps.

8. The apparatus according to claim 7 wherein said photosensor comprises a photodiode operatively connected to a volt meter.

9. The apparatus according to claim 7 wherein said clock is generated by an oscillator operatively connected to said main lamp, the frequency of said clock being dependent on the intensity of said main lamp.

10. The apparatus according to claim 7 wherein said main and flashlamps are operatively connected to said latch by respective opto-isolator circuits.

11. A direct-print system for producing screened prints comprising:
   an enlarger having a main lamp for receiving a photo negative and for exposing an image thereof upon an easel;
   a flashlamp in juxtaposition to said easel for casting light thereupon;
   density sensing means for measuring the density of selected areas of said image;
   a variable timer connected to said flashlamp and said enlarger for regulating the period of time for which said flashlamp and main lamp are illuminated upon said easel; and
   an operator-regulatable power control circuit interconnected between said timer and flashlamp for regulating the intensity of said flashlamp.

12. The system according to claim 11 wherein said power control circuit comprises a power phase control circuit including a charging capacitor connected to and gating a transistor, said charging capacitor being connected to a potentiometer for regulating the rate of charge thereof.

13. The system according to claim 12 which further includes a safe lamp in juxtaposition to said easel, said enlarger and safe lamp being connected to means for mutual exclusive illumination.

* * * * *